US 12,557,555 B2

(12) United States Patent
Motoyama et al.

(10) Patent No.: US 12,557,555 B2
(45) Date of Patent: Feb. 17, 2026

(54) MAGNETIC TUNNEL JUNCTION WITH AN ETCHED BOTTOM ELECTRODE HAVING NON-PLANAR SIDEWALLS

(71) Applicant: International Business Machines Corporation, Armonk, NY (US)

(72) Inventors: Koichi Motoyama, Clifton Park, NY (US); Oscar van der Straten, Guilderland Center, NY (US); Joseph F. Maniscalco, Greenville, SC (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 923 days.

(21) Appl. No.: 17/544,150

(22) Filed: Dec. 7, 2021

(65) Prior Publication Data
US 2023/0180622 A1 Jun. 8, 2023

(51) Int. Cl.
| | | |
|---|---|---|
| H01L 43/08 | (2006.01) | |
| H10B 61/00 | (2023.01) | |
| H10N 50/01 | (2023.01) | |
| H10N 50/10 | (2023.01) | |
| H10N 50/80 | (2023.01) | |

(52) U.S. Cl.
CPC .............. *H10N 50/10* (2023.02); *H10B 61/00* (2023.02); *H10N 50/01* (2023.02); *H10N 50/80* (2023.02)

(58) Field of Classification Search
CPC ........ H10N 50/10; H10N 50/01; H10N 50/80; H10N 50/85; H10B 61/00; H10B 61/22
See application file for complete search history.

(56) References Cited

U.S. PATENT DOCUMENTS

| | | |
|---|---|---|
| 7,214,609 B2 | 5/2007 | Jiang et al. |
| 7,442,637 B2 | 10/2008 | Su et al. |
| 7,923,645 B1 | 4/2011 | Huemoeller et al. |
| 8,048,685 B2 | 11/2011 | Boivin |
| 8,143,138 B2 | 3/2012 | Patz et al. |
| 8,383,510 B2 | 2/2013 | Heinrich et al. |
| 9,224,686 B1 | 12/2015 | Chen et al. |
| 9,553,257 B1 | 1/2017 | Annunziata et al. |
| 9,559,294 B2 | 1/2017 | Chern-Yow |
| 9,905,460 B2 | 2/2018 | Chae et al. |
| 10,032,981 B2 | 7/2018 | Han et al. |
| 10,727,272 B2 | 7/2020 | Chuang et al. |
| 10,727,398 B1 | 7/2020 | Marchack et al. |
| 10,886,197 B2 | 1/2021 | Mignot et al. |
| 2009/0209050 A1 | 8/2009 | Yung-Hung et al. |
| 2011/0049655 A1 | 3/2011 | Assefa et al. |
| 2014/0159244 A1 | 6/2014 | Lu et al. |
| 2016/0308119 A1 | 10/2016 | Chern-Yow et al. |
| 2016/0380028 A1* | 12/2016 | Sonoda ................. H10N 50/01 257/421 |
| 2020/0235286 A1* | 7/2020 | Marchack .............. H10N 50/01 |
| 2020/0321394 A1 | 10/2020 | Hashemi et al. |

* cited by examiner

*Primary Examiner* — Mohammed R Alam
(74) *Attorney, Agent, or Firm* — CANTOR COLBURN LLP; L. Jeffrey Kelly

(57) ABSTRACT

Embodiments of the invention are directed to a structure comprising a magnetic tunnel junction (MTJ) element and an etched bottom electrode (BE) communicatively coupled to the MTJ element. The etched BE includes a substantially non-planar BE sidewall.

11 Claims, 8 Drawing Sheets

MAGNETIC TUNNEL JUNCTION WITH AN ETCHED BOTTOM ELECTRODE HAVING NON-PLANAR SIDEWALLS

BACKGROUND

The present invention relates in general to fabrication methodologies and resulting structures for semiconductor devices. More specifically, the present invention relates to fabrication methodologies and resulting structures for forming a magnetic tunnel junction (MTJ) memory element electrically coupled to an etched bottom electrode having substantially non-planar sidewalls.

Integrated circuits (ICs) are fabricated in a series of stages, including a front-end-of-line (FEOL) stage, a middle-of-line (MOL) stage and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts and other structures that couple to active regions (e.g., gate/source/drain) of the FEOL device elements. Layers of interconnections are formed above these logical and functional layers during the BEOL stage to complete the IC.

Magnetoresistive random access memory (MRAM) can be formed from memory structures such as MTJ stacks, which can be embedded in BEOL interconnect structures. The MTJ stack can be electrically accessed through top and bottom contacts/electrodes that are coupled to top and bottom ends, respectively, of the MTJ stack.

SUMMARY

Embodiments of the invention are directed to a structure that includes a magnetic tunnel junction (MTJ) element communicatively coupled to an etched bottom electrode (BE). The etched BE includes a substantially non-planar BE sidewall.

Embodiments of the invention are directed to a method of forming a structure. The method includes forming a bottom electrode (BE) and forming an MTJ element communicatively coupled to the BE. The BE includes a substantially non-planar BE sidewall.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 2-8 depict a portion of an IC structure after fabrication operations for forming an MTJ memory element and etched bottom electrodes in accordance with embodiments of the invention, in which:

FIG. 2 depicts a cross-sectional view of the IC structure after fabrication operations according to embodiments of the invention;

FIG. 3 depicts a cross-sectional view of the IC structure after fabrication operations according to embodiments of the invention;

FIG. 4 depicts a cross-sectional view of the IC structure after fabrication operations according to embodiments of the invention;

FIG. 5 depicts a cross-sectional view of the IC structure after fabrication operations according to embodiments of the invention;

FIG. 6 depicts a cross-sectional view of the IC structure after fabrication operations according to embodiments of the invention;

FIG. 7 depicts a cross-sectional view of the IC structure after fabrication operations according to embodiments of the invention; and FIG. 8 depicts a cross-sectional view of the IC structure after fabrication operations according to embodiments of the invention.

DETAILED DESCRIPTION

Figure 1:
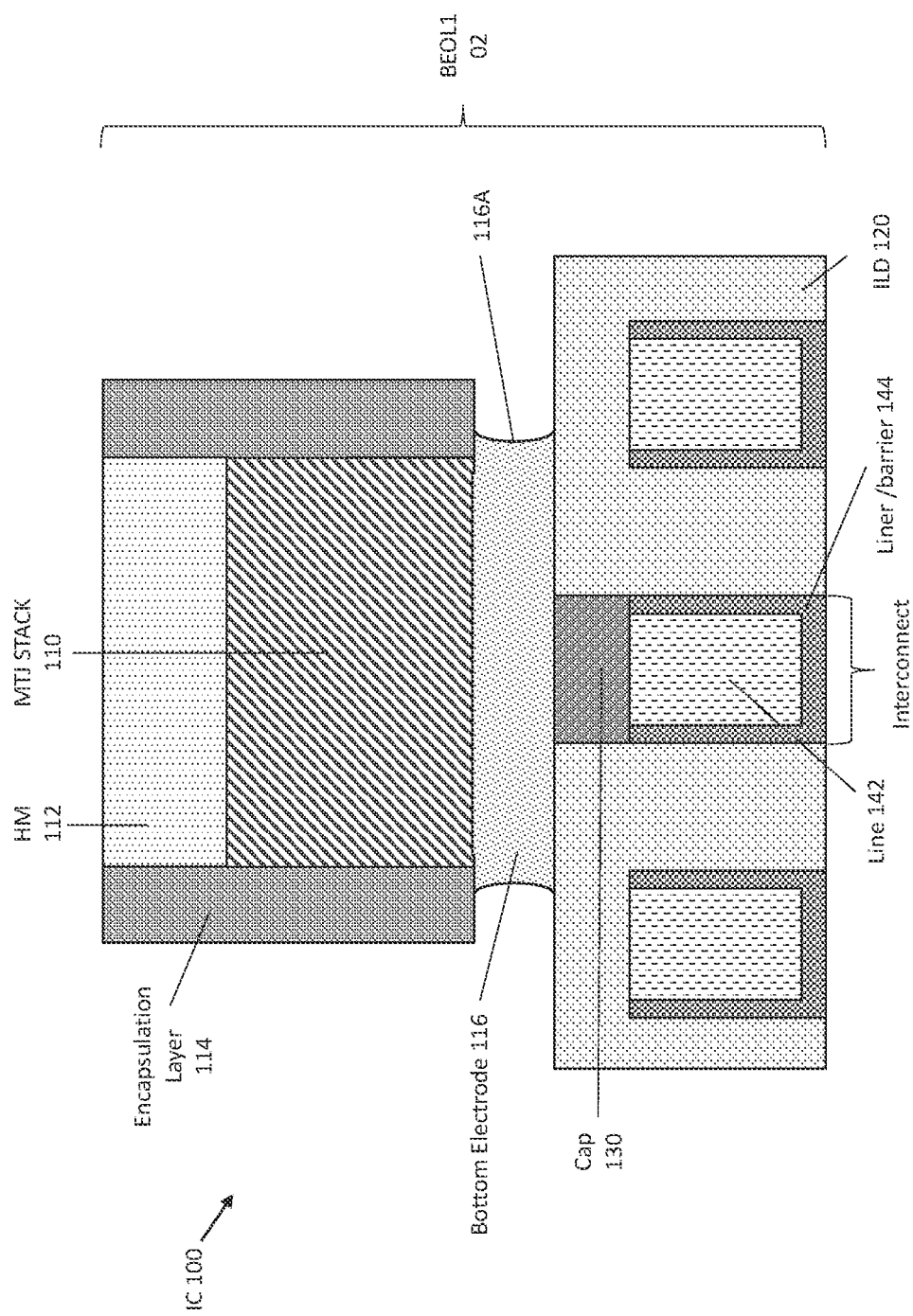
FIG. 1 depicts a cross-sectional view of an IC structure having an MTJ stack and etched bottom electrode according to embodiments of the invention.

It is understood in advance that, although this description includes a detailed description of the formation and resulting structures for a specific type of embedded MTJ stack, implementation of the teachings recited herein are not limited to the particular type of embedded memory element or IC architecture described herein. Rather embodiments of the present invention are capable of being implemented in conjunction with any other type of memory element or IC architecture, now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the fabrication of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, magnetoresistive random access memory (MRAM) is a non-volatile memory that combines a magnetic device with standard silicon-based microelectronics. The main MRAM storage element is known as a magnetic tunnel junction (MTJ). A basic MTJ stack includes a free layer and a fixed/reference layer, each of which includes a magnetic material layer. The free and reference layers are separated by a non-magnetic insulating tunnel barrier. The free layer and the reference layer are magnetically de-coupled by the tunnel barrier. The free layer has a variable magnetization direction, and the reference layer has an invariable magnetization direction. A wide variety of layers and elements (e.g., an MTJ cap, multiple free/reference layers, etc.) can be included in an MTJ stack. The MTJ stack stores information by switching the magnetization state of the free layer. When the free layer's magnetization direction is parallel to the reference layer's magnetization direction, the MTJ is in a low resistance state. Conversely, when the free layer's magnetization direction is anti-parallel to the reference layer's magnetization direction, the MTJ is in a high resistance state. The difference in resistance of the MTJ can be used to indicate a logical "1" or "0," thereby storing a bit of information. The tunneling magnetoresistance (TMR or MR) of an MTJ determines the difference in resistance between the high and low resistance states. A relatively high difference between the high and low resistance states facilitates read operations in the MRAM.

As previously described herein, MTJ stacks can be embedded in interconnect structures of the IC. Typically, the interconnect structures include conductive lines (or wires) and metal-filled conductive vias. For a variety of reasons, it is desirable to not place the MTJ stack directly on an interconnect structure of the IC. In general, the MTJ is a somewhat fragile element that must be carefully interfaced with other IC structures. For example, the wires and metal-filled vias that form the interconnect structures are typically formed from copper and/or cobalt. Cobalt is a magnetic material, and copper is known to diffuse easily during IC fabrication operations. Accordingly, in order to minimize the potential for the magnetic and diffusion properties of cobalt and copper, respectively, the MTJ stack is typically coupled to the interconnect structures through newly deposited top and bottom contacts/electrodes (e.g., TiN (titanium nitride) or TaN (tantalum nitride), or ruthenium (Ru)).

In known MRAM fabrication operations, the MTJ and bottom electrode can be fabricated by depositing bulk layers of the MTJ stack and the bottom electrode then removing selected portions of the bulk layers the bottom electrode to form a final MTJ pillar structure. However, the processes to remove selected portions of the bulk MTJ stack and the bulk bottom electrode (e.g., reactive ion etch (ME) and ion beam etch (IBE) processing) present challenges because they can damage underlying low-k dielectric layers and interconnect structures (e.g., lines and vias) embedded therein, which results in metal debris (e.g., sputtered metal) on sidewalls of the MTJ stack and increases the potential for short circuits.

Turning now to an overview of aspects of the invention, embodiments of the invention provide fabrication methodologies and resulting structures for forming an MTJ memory element electrically coupled to an etched bottom electrode having substantially non-planar sidewalls. Because the bottom electrode is formed by selective metal etching that does not attack the underlying insulating region (e.g., low-k dielectric materials), both the underlying insulating region and the conductive metal lines embedded therein are not damaged by the bottom electrode etch operations. Because the underlying conductive metal lines are not damaged by the bottom electrode etch, re-sputtered (or sputtered) metal from damaged conductive metal lines does not damage sidewalls of the MTJ stack. In some embodiments of the invention, the MTJ stack is further protected from damage by forming encapsulation layers on sidewalls of the MTJ stack before the bottom electrode is etched.

In some embodiments of the invention, the bottom electrode etch is a multi-directional etch, which allows a width dimension and sidewall positioning of the final bottom electrode to be well-controlled. In some embodiments of the invention, the bottom electrode etch controls the bottom electrode width dimension such that it is greater than the MTJ stack's corresponding width dimension. By ensuring that the bottom electrode width dimension is greater than the MTJ stack width dimension, an electrical contact that interfaces with sidewalls of the bottom electrode will not also make electrical contact with active regions of the MTJ stack. In some embodiments of the invention, the bottom electrode width dimension is controlled to position sidewalls of the bottom electrode beneath encapsulation layers on sidewalls of the MTJ stack, which further ensures that contacts to sidewalls of the bottom electrode do not also contact active regions of the MTJ stack. In some embodiments of the invention, the multi-directional bottom electrode etch results in the previously-described substantially non-planar bottom electrode sidewalls. In some embodiments of the invention, the substantially non-planar BE sidewalls are curved. In some embodiments of the invention, the substantially non-planar BE sidewalls are concave. In some embodiments of the invention, the multi-directional bottom electrode etch is separate and distinct from the operations used to form (or etch) the final MTJ stack.

An MTJ stack and etched bottom electrode can be fabricated in accordance with embodiments of the invention by depositing bulk bottom electrode material on a substrate (e.g., a layer of low-k dielectric) then planarizing the bulk bottom electrode material. Layers of bulk MTJ stack material are formed on the bulk bottom electrode and etched to form the MTJ stack, stopping at the bulk bottom electrode. An encapsulation layer is formed over the MTJ stack and the bulk bottom electrode by depositing bulk encapsulation material over the MTJ stack and the bulk bottom electrode then selectively removing portions of the bulk encapsulation material such that the encapsulation layer remains on sidewalls of the MTJ stack. A multi-directional etch is applied to exposed surfaces of the bulk bottom electrode to form the final bottom electrode and control a width dimension of the final bottom electrode, as well as the position of the bottom electrode sidewalls. The multi-directional bottom electrode etch results in sidewalls of the bottom electrode being substantially non-planar.

Accordingly, aspects of the present invention address the shortcomings of known MTJ and bottom electrode fabrication operations by providing multi-directional bottom electrode etch operations configured and arranged to prevent metal re-sputtering (or sputtering) from metal lines that are embedded in dielectric material that is below the bottom electrode, thereby decreasing the likelihood of re-sputtered/sputtered metal attaching to sidewalls of the MTJ and causing short circuits. Embodiments of the invention result in little to no damage or gouging of dielectrics (e.g., low-k dielectrics) below the bottom electrode. Embodiments of the invention do not significantly change the conventional fabrication process flow.

Turning now to a more detailed description of example embodiments of the invention, FIG. 1 depicts a portion of an IC 100 in accordance with the aspects of this invention. The depicted portion of the IC 100 includes a back-end-of-line (BEOL) region 102 of the IC 100 in which an MTJ stack 110 and a hardmask (HM) 112 are over an etched bottom electrode 116. In embodiments of the invention, the HM 112 is formed from a metal. Encapsulation layers 114 are formed on the sidewalls of MTJ stack 110 and HM 112. In accordance with aspects of the invention, the bottom electrode etch used to form the etched bottom electrode 116 results in the etched bottom electrode 116 having a well-controlled width dimension that is larger than a width dimension of the MTJ stack. The bottom electrode etch results in etched sidewalls 116A of the etched bottom electrode 116 being substantially non-planar. In some embodiments of the invention, the etched bottom electrode sidewalls 116A can be curved. In some embodiments of the invention, the etched bottom electrode sidewalls 116A can be concave. The etched bottom electrode 116 is on an interlayer dielectric (ILD) 120 (e.g., a low-k dielectric) having interconnect structures 140 formed therein. Each interconnect structure 140 includes a conductive line 142 surrounded by a liner/barrier 144 configured to serve multiple functions. For example, the liner/barrier 144 can function as a barrier to prevent metals in the interconnect structures 140 from migrating into the surrounding ILD 120. Additionally, the liner/barrier 144 can provide adhesion between the metal interconnect structures 140 and the surrounding ILD 120. The MTJ stack 110 is electrically coupled through the etched bottom electrode 116 and a metal cap 130 to one of the interconnect structures 140.

Figure 2:
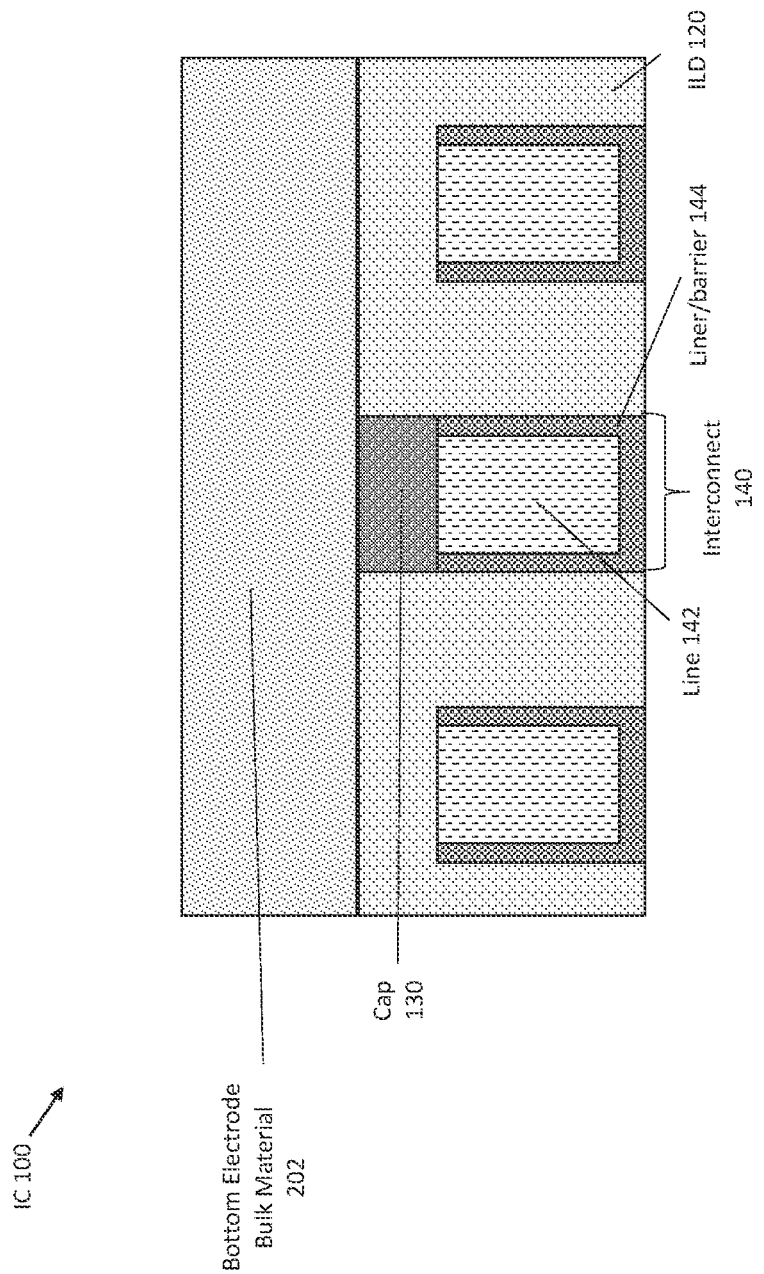

FIGS. 2-8 depict the IC 100 after fabrication processes for forming the IC 100 (as shown in FIG. 1) in accordance with embodiments of the invention. In FIG. 2, known fabrication operations have been used to form the ILD 120 having the interconnect structures 140 and the metal cap 130 embedded therein. Known fabrication operations have also been used to deposit a bottom electrode bulk material 202 over the ILD 120 and the metal cap 130.

Figure 3:
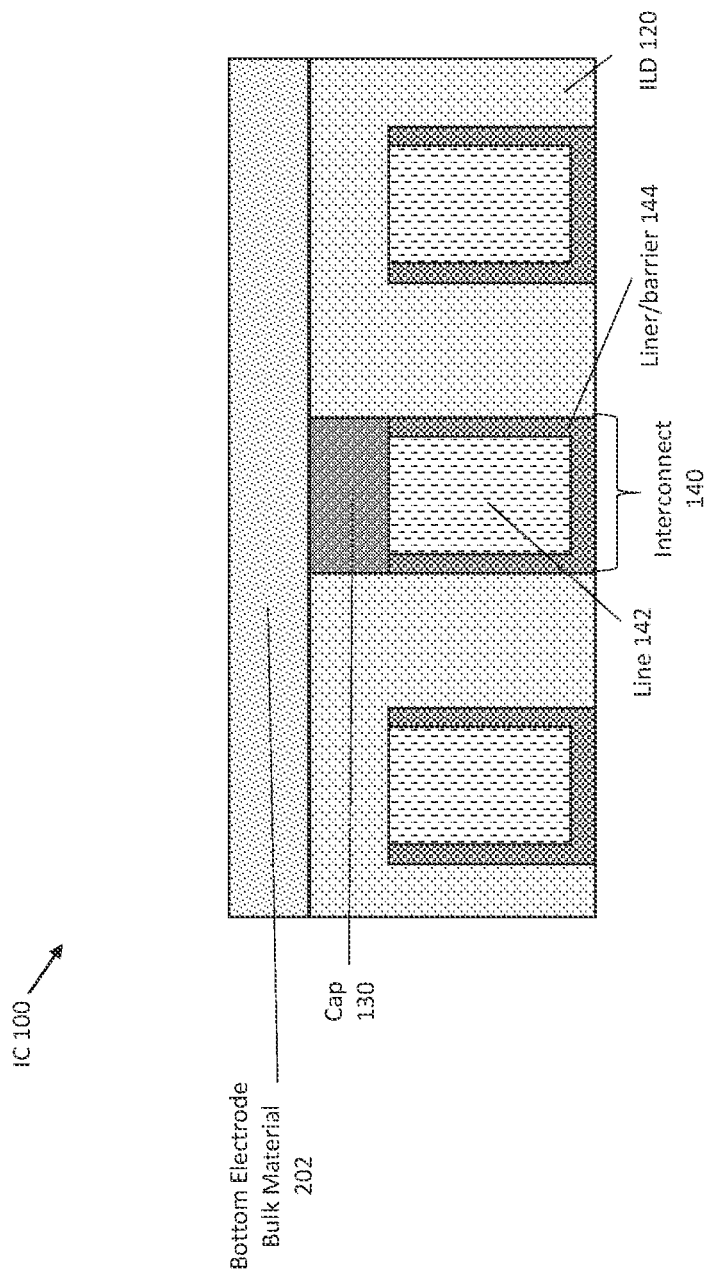

In FIG. 3, known fabrication operations (e.g., CMP) have been used to planarize the bottom electrode bulk material 202 and reduce the bottom electrode bulk material 202 to a desired height or thickness.

Figure 4:
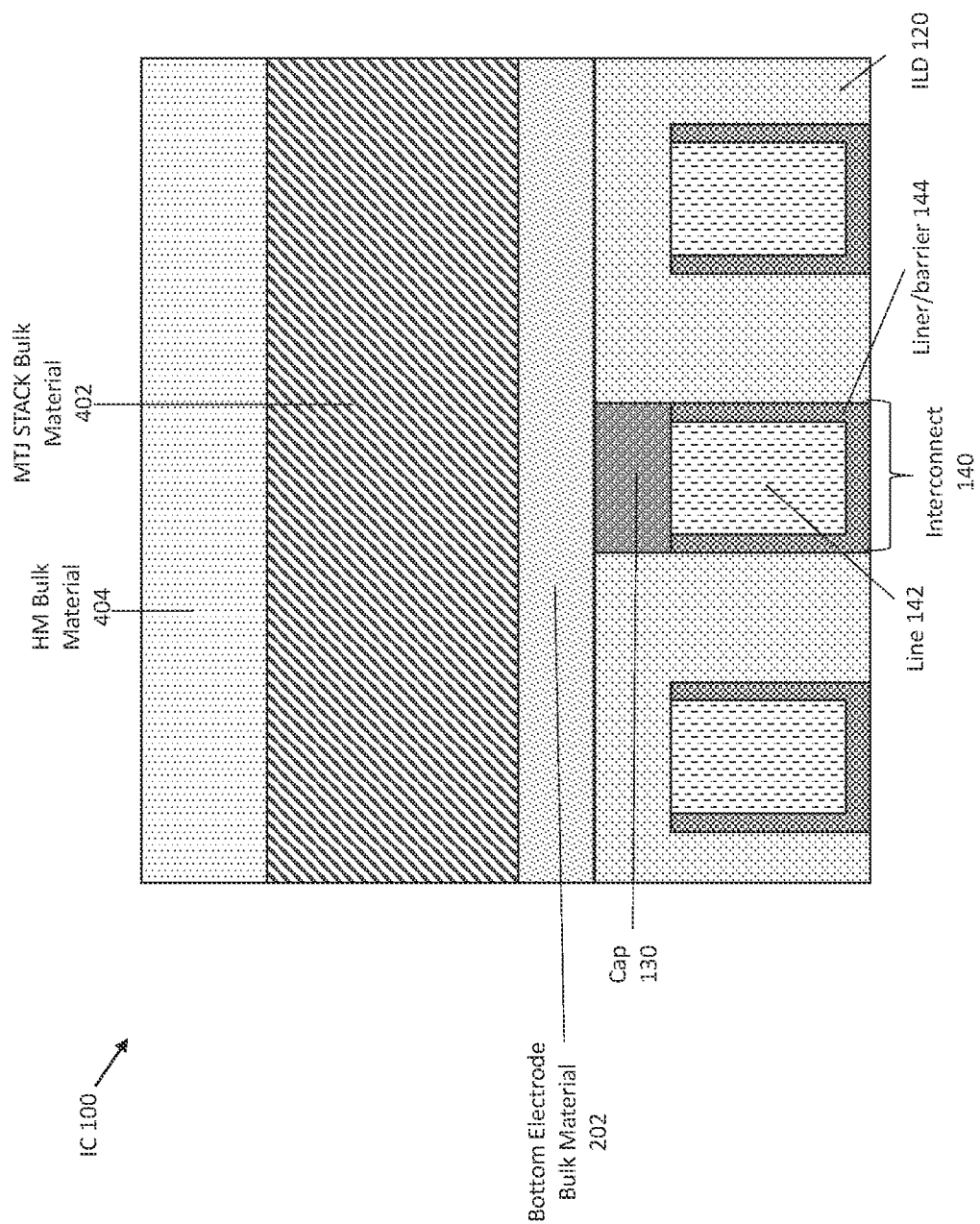

In FIG. 4, known fabrication operations have been used to form and planarize MTJ stack bulk material 402 over the bottom electrode bulk material 202. Known fabrication operations have also been used to form and planarize HM bulk material 404 over the MTJ stack bulk material 402.

Figure 5:
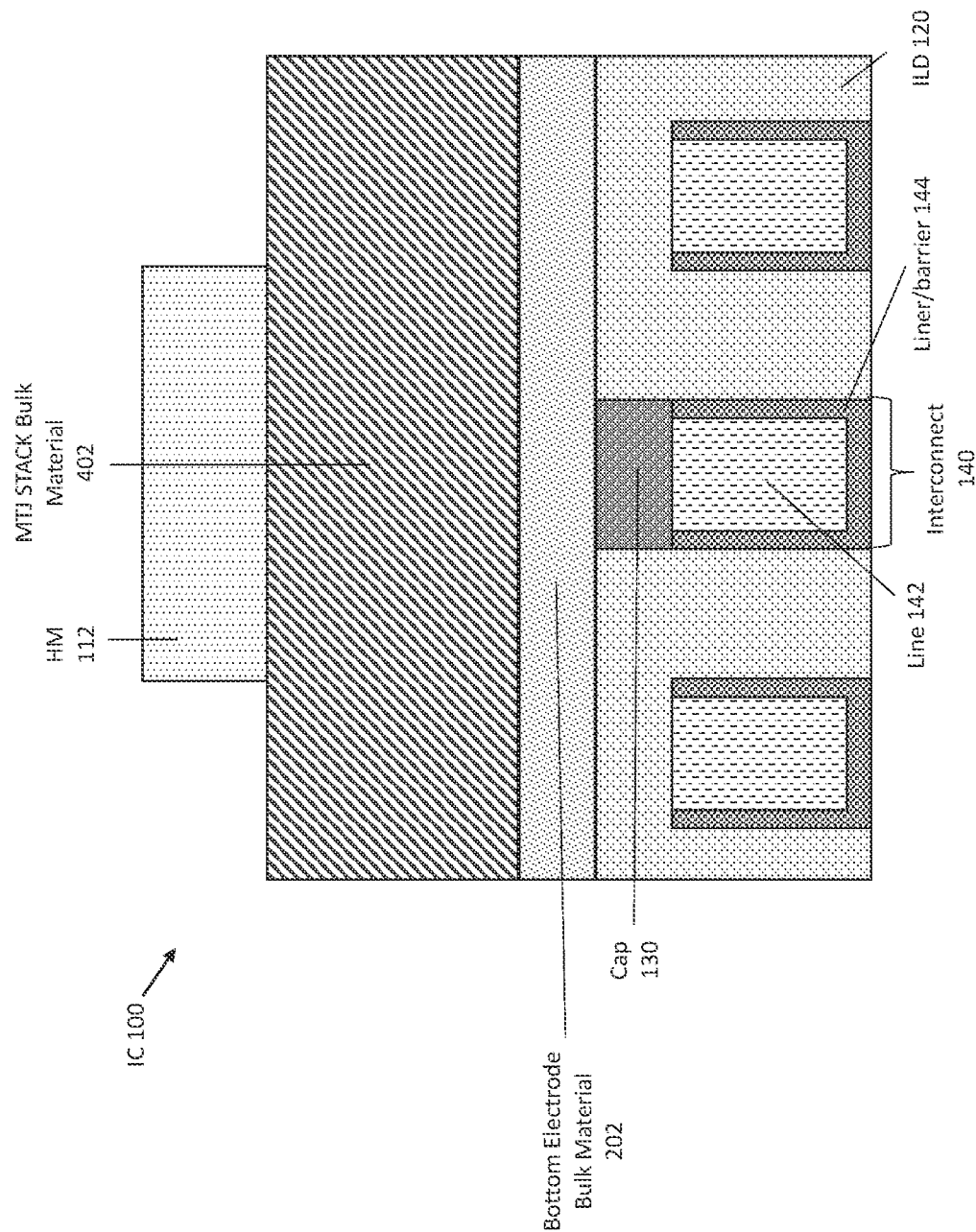

In FIG. 5, known fabrication operations have been used to pattern and etch the HM bulk material 404 (shown in FIG. 4) to form the HM 112. The HM 112 defines a desired footprint of the MTJ stack 110 (shown in FIG. 1) and exposes surfaces of the MTJ stack bulk material 402.

Figure 6:
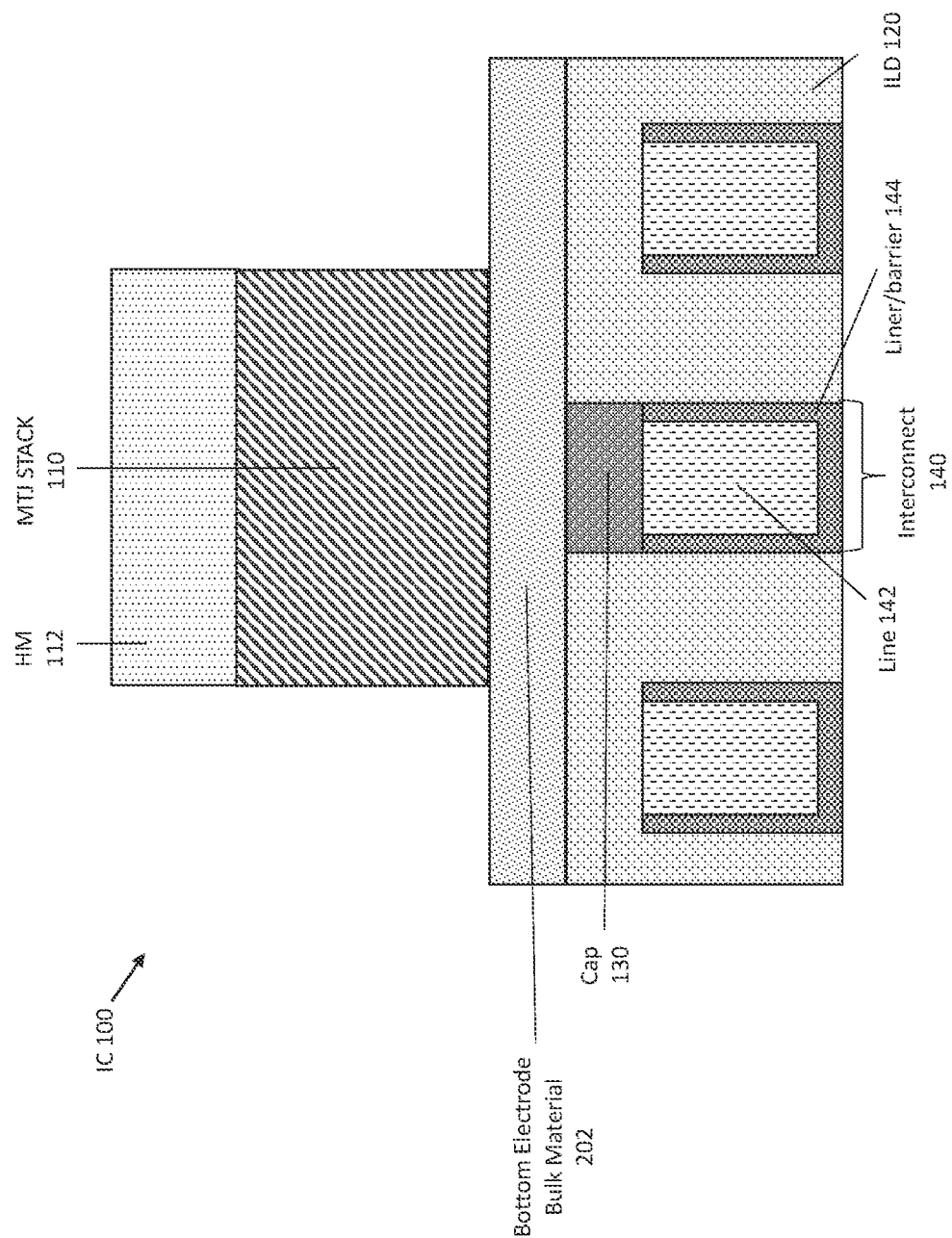

In FIG. 6, know fabrication operations have been used to remove or etch through exposed surfaces of the MTJ stack bulk material 402 (shown in FIG. 5) to form the MTJ stack 110 that tracks the footprint of the HM 112. The etching process applied to the MTJ stack bulk material 402 stops at bottom electrode bulk material 202, thereby exposing top surfaces of the bottom electrode bulk material 202. The etching processes uses to form the MTJ stack 110 can involve an aggressive directional etch (e.g., reactive ion beam etch (IBE)).

Figure 7:
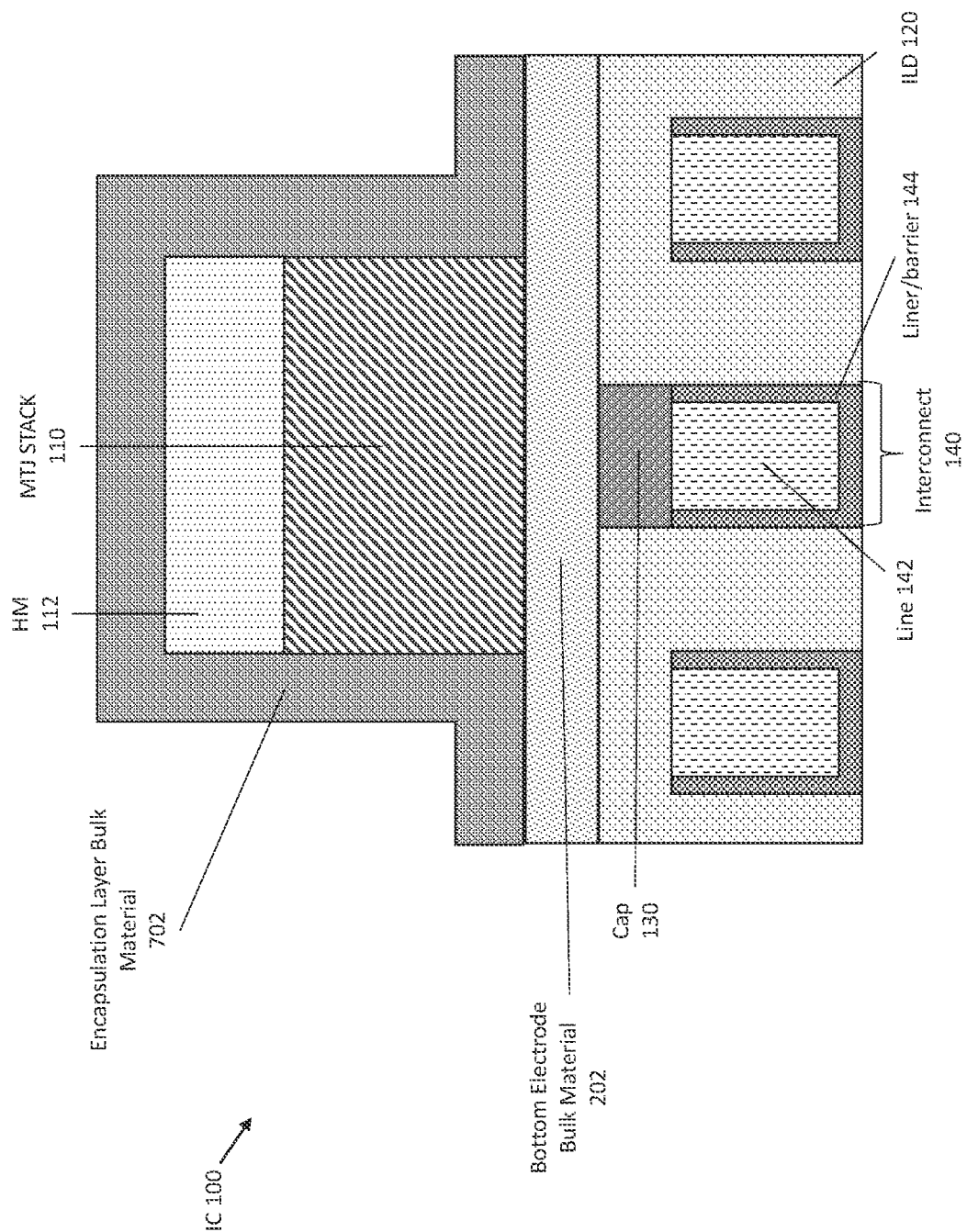

In FIG. 7, known fabrication operations have been used to conformally form encapsulation layer bulk material 702 over the IC 100, and more specifically over the exposed surfaces of the bottom electrode bulk material 202, along sidewalls of the MTJ stack 110, and over the HM 112. In aspects of the invention, the encapsulation layer bulk material 702 can be formed from any suitable dielectric material (e.g., silicon nitride), which can include other elements such as Si, C, N, O, and the like.

Figure 8:
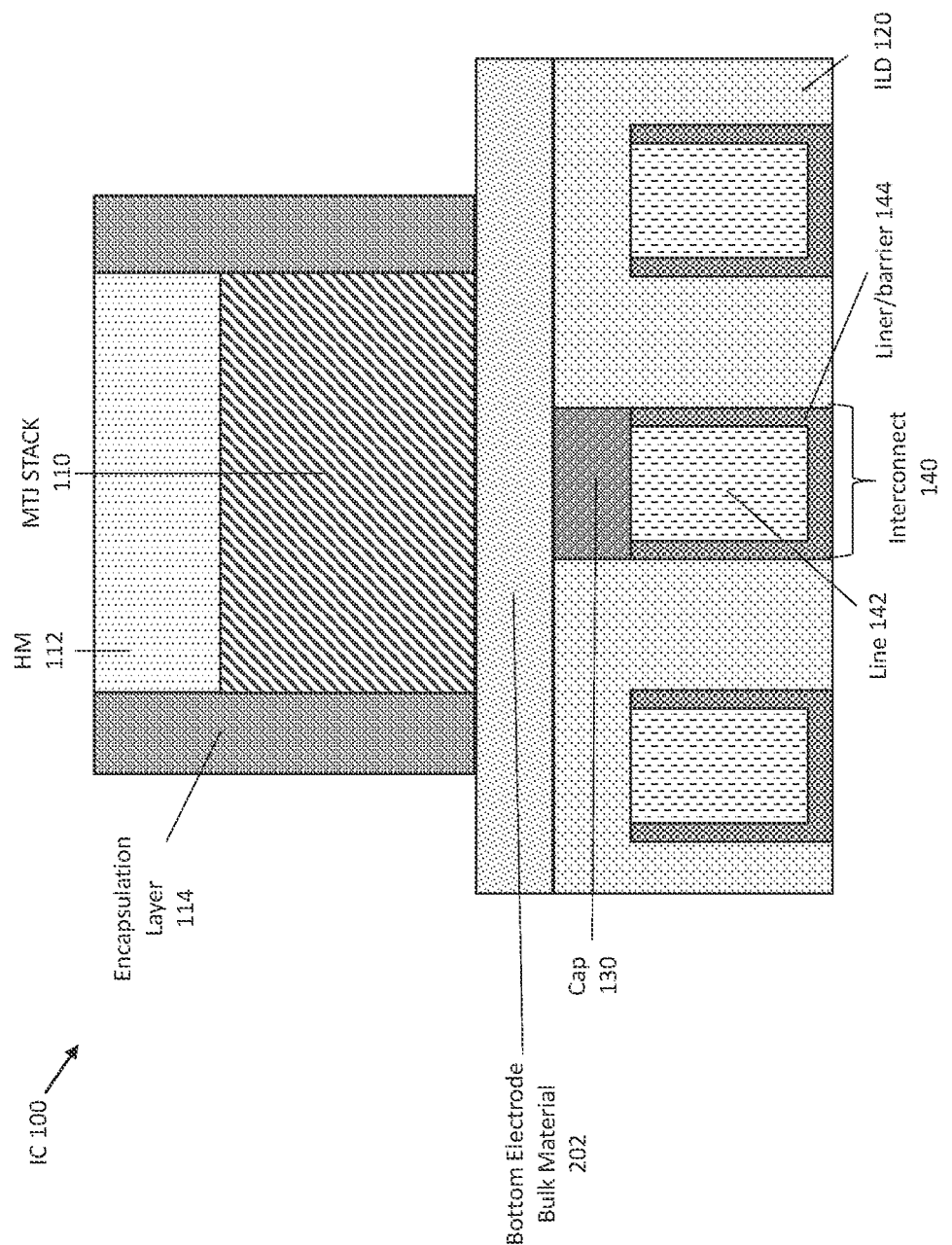

In FIG. 8, known fabrication operations (e.g., a directional etch) have been used to remove the encapsulation layer bulk material 702 from horizontal surfaces of the IC 100, thereby forming encapsulation layer 114. The encapsulation layer 114 is only present on sidewalls of MTJ stack 110 and HM 112, as well as on a portion of a top surface of bottom electrode bulk material 202.

After the fabrication operations depicted in FIG. 8, known fabrication operations are used to etch the bottom electrode bulk material 202, thereby forming the etched bottom electrode 116 of the IC 100 shown in FIG. 1. In accordance with embodiment of the invention, the bottom electrode bulk material 202 is etched using a multi-directional metal etch that is selective to the bottom electrode bulk material 202 but non-selective to the ILD 120. In embodiments of the invention, the multi-directional metal etch is a wet etch configured and arranged to etch the metals of the bottom electrode bulk material 202 and not etch the ILD 120. In embodiments of the invention, the bottom electrode bulk material 202 is a conductive material such as TaN, TiN, and the like, and the multi-directional metal etch is a wet etch process that etches TaN, TiN, and the like while leaving the ILD 120 substantially intact. In some embodiments of the invention, the bottom electrode bulk material 202 can be formed from metals that can be etched by a dry etch that is selective to the bottom electrode bulk material 202 and non-selective to the ILD 120. Accordingly, the multi-directional metal etch removes the bottom electrode bulk material 202 in vertical and horizontal, which results in the etched bottom electrode 116 having substantially non-planar etched bottom electrode sidewalls 116A. In embodiments of the invention, the multi-directional metal etch can be timed in a manner that controls a final width dimension of the etched bottom electrode 116 and a final position of the etched bottom electrode sidewalls 116A. In some embodiments of the invention, the multi-directional metal etch controls the width dimension of the etched bottom electrode 116 such that it is greater than a width dimension of the MTJ stack 110. By ensuring that the width dimension of the etched bottom electrode 116 width dimension is greater than a width dimension of the MTJ stack 110, an electrical contact (not shown) that interfaces with the etched bottom electrode sidewalls 116A will not also make electrical contact with active regions of the MTJ stack 110. In some embodiments of the invention, the multi-directional metal etch controls the width dimension of the etched bottom electrode 116 position the etched bottom electrode sidewalls 116A beneath encapsulation layers 114 on sidewalls of the MTJ stack 110, which further ensures that contacts to the etched bottom electrode sidewalls 116A do not also contact active regions of the MTJ stack 110. In some embodiments of the invention, the multi-directional bottom electrode etch results in substantially non-planar bottom electrode sidewalls. In accordance with embodiments of the invention, the multi-directional metal etch applied to the bottom electrode bulk material 202 does not involve an aggressive directional etch (e.g., reactive ion beam etch (IBE)) that can damage the underlying ILD 120 and the interconnect structures 140 embedded therein, thereby avoiding re-sputtering (or unintentional sputtering) of metal in the interconnect structures 140 onto the MTJ stack 110.

Notwithstanding the above, the following materials are contemplated for use in embodiments of the invention. The conductive lines 142 can be copper (Cu), cobalt (Co), nickel (Ni), or any other suitable conductive material. The liner/barrier 144 can be titanium nitride (TiN), tantalum nitride (TaN), ruthenium (Ru), hafnium nitride (HfN), niobium nitride (NbN), tungsten nitride (WN), tungsten carbon nitride (WCN), or combinations thereof. The ILD 120 can be formed from a low-k dielectric (e.g., k less than about 4), an ultra-low-k (ULK) dielectric (e.g., k less than about 2.5), tetraethoxysilane (TEOS), black diamond III (BDIII), and the like, or any suitable combination of those materials. The bottom electrode 116 can be formed from a variety of conductive materials including, for example, Ta, TaN, Ti, TiN, W, WN, and Ru. The encapsulation layer 114 can be formed from any suitable dielectric materials (e.g., silicon nitride), which can include other elements such as Si, C, N, O, and the like.

The methods described herein can be used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a structure, the method comprising:
   forming a bottom electrode (BE); and
   forming a magnetic tunnel junction (MTJ) element communicatively coupled to the BE;
   wherein the BE comprises a substantially concave BE sidewall comprising a center portion between a top and a bottom of a height dimension, the substantially concave BE sidewall comprising a top curved portion above the center portion that is symmetric to a bottom curved portion below the center portion; and
   wherein forming the substantially concave BE sidewall comprises etching the substantially concave BE sidewall to be symmetrically concave from the top to the bottom of the height dimension while avoiding use of a reactive ion beam etch (IBE) that can damage an underlying material.

2. The method of claim 1, wherein the height dimension is vertical.

3. The method of claim 1 further comprising forming an encapsulation layer on a sidewall of the MTJ element.

4. The method of claim 3, wherein the substantially concave BE sidewall is beneath the encapsulation layer.

5. The method of claim 3, wherein:
   the BE comprises a BE width dimension;
   the MTJ element comprises an MTJ element width dimension; and
   the BE width dimension is greater than the MTJ element width dimension.

6. The method of claim 1, wherein forming the MTJ element comprises forming layers of the MTJ element and applying a first removal process to remove portions of the layers of the MTJ element to expose a surface of the BE.

7. The method of claim 6, wherein forming the BE comprises applying a second removal process to the exposed surface of the BE such that the BE comprises the substantially concave BE sidewall.

8. A method of forming a structure, the method comprising:
   forming a bottom electrode (BE); and
   forming a magnetic tunnel junction (MTJ) element communicatively coupled to the BE;
   wherein forming the MTJ element comprises forming layers of the MTJ element and applying a first removal process to remove portions of the layers of the MTJ element to expose a surface of the BE;
   wherein the BE comprises a substantially concave BE sidewall comprising a center portion between a top and a bottom of a height dimension, the substantially concave BE sidewall comprising a top curved portion above the center portion that is symmetric to a bottom curved portion below the center portion;
   wherein forming the BE comprises applying a second removal process to the exposed surface of the BE such that the BE comprises the substantially concave BE sidewall;
   wherein the second removal process comprises a multi-directional etch that:
      does not damage an insulating region below the BE; and does not sputter metal material in the insulating region onto the MTJ element.

9. The method of claim 4, wherein:

forming the BE comprises applying a BE removal process to an exposed surface of the BE such that the BE comprises the substantially concave BE sidewall; and the BE removal process is controlled such that the substantially concave BE sidewall is beneath the encapsulation layer.

10. The method of claim 4, wherein:

forming the BE comprises applying a BE removal process to an exposed surface of the BE such that the BE comprises the substantially concave BE sidewall; and the BE removal process is controlled such that the substantially concave BE sidewall is not beneath the MTJ element.

11. The method of claim 5, wherein:

forming the BE comprises applying a BE removal process to an exposed surface of the BE such that the BE comprises the substantially concave BE sidewall; and the BE removal process is controlled such that the BE width dimension is greater than the MTJ element width dimension.

\* \* \* \* \*